United States Patent [19]

Krivanek

[11] Patent Number: 5,065,029

[45] Date of Patent: Nov. 12, 1991

[54] COOLED CCD CAMERA FOR AN ELECTRON MICROSCOPE

[75] Inventor: Ondrej L. Krivanek, Oakland, Calif.

[73] Assignee: Gatan, Inc., Pleasanton, Calif.

[21] Appl. No.: 562,667

[22] Filed: Aug. 3, 1990

[51] Int. Cl.⁵ .................. H01J 37/18; H01J 37/22
[52] U.S. Cl. .................. 250/441.1; 250/310; 250/311; 250/397; 358/93; 358/229; 358/213.16
[58] Field of Search .................. 250/441.1, 311, 310, 250/397; 358/93, 229, 213.16

[56] References Cited

U.S. PATENT DOCUMENTS 4,739,399  4/1988  Swann et al. .................. 358/93

OTHER PUBLICATIONS

Strauss et al., Ultramicroscopy 22 (1987), pp. 117-124.
Zuo et al., Proceedings of the 46th Annual Meeting of the Electron Microscopy Society of America, 1988, pp. 656-657.
Mochel & Mochel, A CCD Imaging and Analysis System for the VG HB5 STEM, Proceedings 44th Annual EMSA Meeting, 1986, 616-617.

Primary Examiner—Jack I. Berman

[57] ABSTRACT

An apparatus comprising a cooled slow-scan charge-coupled device camera mounted in a chamber attached to a projection or specimen chamber of an electron microscope, and a vacuum valve separating the camera chamber from the microscope chamber. The operation of the vacuum valve is linked to the microscope vacuum system such that the valve remains open while the microscope chamber is under vacuum, but closes if the microscope chamber is about to be let up to atmospheric pressure, and stays closed until the microscope chamber is evacuated again. In an alternate embodiment of the invention, the camera is inserted by a pneumatically operated piston to the microscope chamber, and is withdrawn and sealed off in a separate vacuum chamber in the microscope chamber is about to be let up to air.

12 Claims, 4 Drawing Sheets

COOLED CCD CAMERA FOR AN ELECTRON MICROSCOPE

BACKGROUND OF THE INVENTION

1. Field of the Invention

The invention relates to cameras for recording images and diffraction patterns produced by transmission electron microscopes or scanning electron microscopes, and particularly to cameras comprising cooled charge-coupled devices.

2. Description of Prior Art

Images and diffraction patterns produced by transmission electron microscopes are typically observed in real time on a fluorescent screen. When the adjustment of the electron microscope has been fully optimized, the images are recorded on photographic film inserted directly into the vacuum of the electron microscope. In modern electron microscopes, the fluorescent screen is usually replaced by a TV camera which is used for real-time observation, but the photographic film is retained as the medium of choice for recording images.

The resolution, sensitivity, and number of pixels available on photographic film are generally satisfactory, but the dynamic range of photographic film is limited to typically less than 1:500, and the response of the film to different electron intensities is typically very non-linear. Further, the photographic film is not reusable, which makes it relatively costly, and must be chemically processed, which is slow and tedious. The resultant delay of typically several hours between the time the image is recorded and the time it is available for analysis is especially inconvenient when the images are to be processed and analyzed by a computer.

A better approach to recording electron microscope images and diffraction patterns is to convert the electron image to a light image in an electron scintillator, and use a charge-coupled device (CCD) of the type originally developed for astronomy to read the light image into a computer. Such cameras offer excellent resolution, sensitivity, linearity, up to 2048 by 2048 pixels, are reusable, and make the image available for processing and analysis within a few seconds after it was recorded. However, the CCD sensor must typically be cooled to about −30° C. during operation in order to supress its intrinsic dark current to a level permitting exposures of several tens of seconds. This requires the sensor to be housed in a vacuum enclosure, in order to prevent ice build up which can potentially destroy it.

Two types of cameras using cooled, slow scan CCDs have been developed for electron microscopy. Both types house the CCD in a sealed vacuum enclosure which is isolated from the microscope vacuum. In the first type of CCD camera, the CCD enclosure has a glass window, and an image produced by the electron beam incident on a scintillator inside the electron microscope is transferred through the window onto the CCD using glass lenses. Unfortunately, the poor light collection efficiency of glass lenses prevents this type from attaining the sensitivity necessary for recording faint electron images, especially images from radiation-sensitive materials. Further, the vacuum inside the CCD enclosure typically degrades over time, and must be periodically renewed using an auxiliary vacuum station.

In the second type of CCD camera, the vacuum enclosure has a fiber-optic window. One side of the window is inside the microscope vacuum, and is coupled to a scintillator. The other side is inside the CCD vacuum, and is coupled to the CCD. This type attains a higher optical coupling efficiency and therefore a better sensitivity. However, the fiber-optic plate is in thermal contact with both the CCD and the wall of the vacuum enclosure, and this reduces the CCD cooling efficiency to the point where liquid nitrogen must be used to attain a sufficiently low operating temperature. Further, to prevent water condensation on the scintillator which is also in thermal contact with the CCD via the fiber-optic plate, the plate must be quite thick so that the scintillator can stay close to room temperature while the CCD is at a low temperature. Thick fiber-optic plates typically contain many broken fibers and other optical defects, and this significantly degrades the quality of the image recorded by the CCD. Finally, just like with the first type, the vacuum inside the enclosure degrades and must be periodically renewed.

Most users of electron microscopes would find significant advantage in an image recording device combining the good sensitivity of a fiber-optically coupled CCD with the defect-free image quality possible when thick fiber-optic plates are not used. They would also find advantage in a CCD camera whose internal vacuum did not need periodic renewal, and which attained a low enough temperature without the use of liquid nitrogen.

OBJECTS AND ADVANTAGES

Accordingly, several of the objects and advantages of the present invention are: to provide a slow scan CCD camera which produces images free of defects and with good sensitivity, does not need liquid nitrogen cooling, does not require its vacuum to be renewed periodically, is simple to operate, and is compatible with existing film cameras which must be let up to atmospheric pressure when the film magazine is to be changed.

Readers will find further objects and advantages of the invention from a consideration of the ensuing description and the accompanying figures.

DRAWING FIGURES

DRAWING REFERENCE NUMERALS

Figure 1:
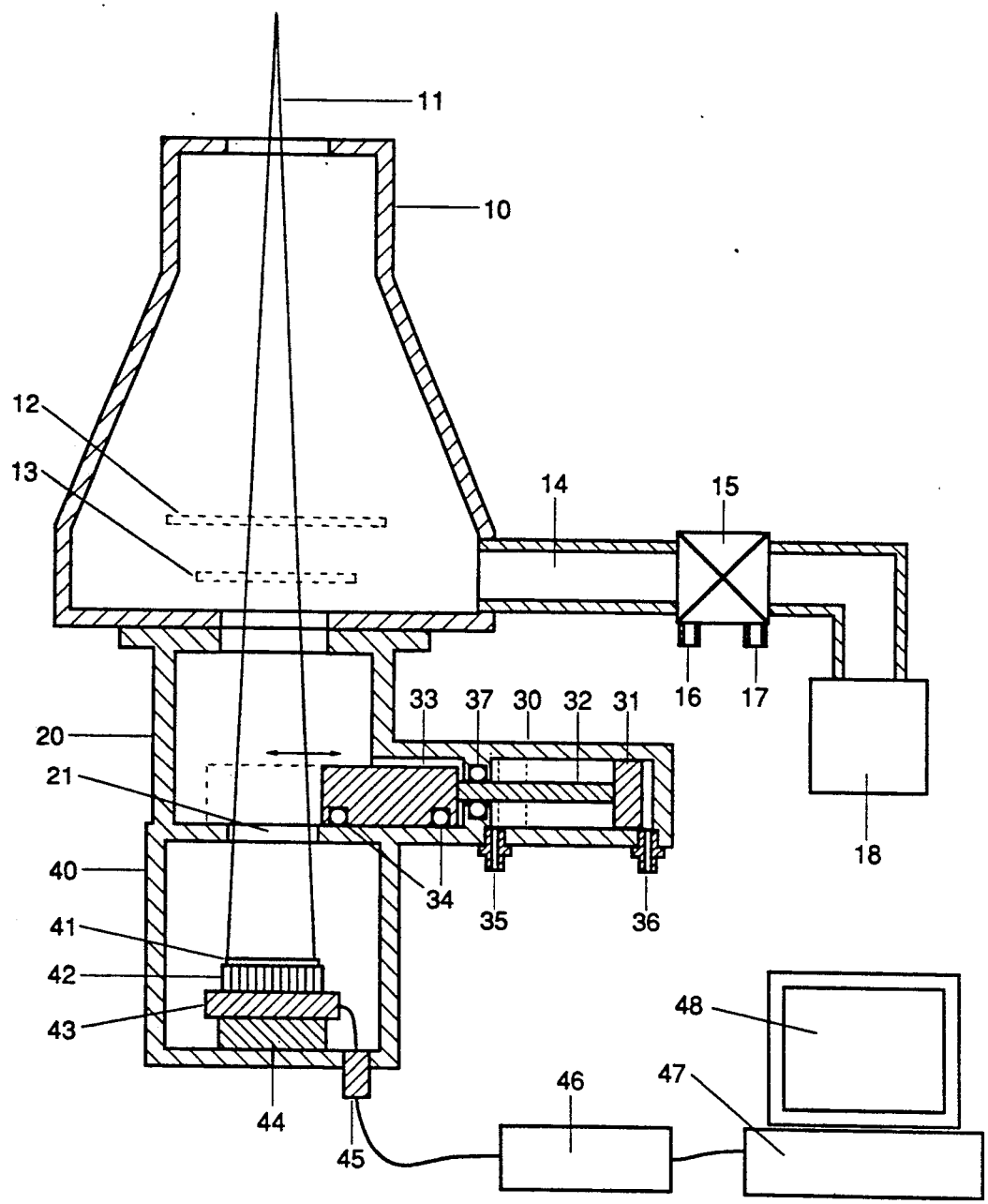
FIG. 1 shows a schematic cross-section of a cooled CCD camera housed in a vacuum enclosure attached to a projection chamber of an electron microscope.

10: projection chamber of an electron microscope
11: electron beam
12: viewing screen (removable)
13: photographic film sheet (removable)

14: evacuation pipe
15: gate valve
16: pressurized air inlet
17: pressurized air inlet
18: high vacuum pump
20: intermediate chamber
21: camera aperture
30: pneumatic cylinder chamber
31: piston
32: rod
33: vacuum valve
34: O-ring
35: pressurized air inlet
36: pressurized air inlet
37: O-ring
40: camera
41: electron scintillator
42: fiber-optic face plate
43: charge-coupled device sensor
44: thermoelectric cooler
45: vacuum feed-thru
46: camera electronics
47: digital computer
48: computer display
50: camera
51: O-ring
52: opening
53: electron scintillator
54: fiber-optic face plate
55: charge-coupled device sensor
56: thermoelectric cooler
57: rod
60: camera housing
61: vacuum chamber
62: pneumatic piston chamber
63: pneumatic piston
64: pressurized air inlet
65: pressurized air inlet
66: O-ring
67: O-ring
70: pneumatic piston chamber
71: piston
72: rod
73: pressurized air inlet
74: O-ring
75: O-ring
80: pneumatic control unit
91: vacuum opening
92: piston
93: rod
94: O-ring
95: O-ring
96: pressurized air inlet
97: pressurized air inlet

DESCRIPTION

FIG. 1 show a schematic view of a slow-scan charge-coupled device (CCD) camera 40 mounted on projection chamber 10 of a transmission electron microscope (TEM). Typically the projection chamber is attached to the end of an optical column of a TEM, and houses a viewing screen 12 which is either lowered into an observation position or raised into a position in which it does not intercept electron beam 11 projected into the chamber. The projection chamber also typically houses a film magazine comprising a transport mechanism which inserts a sheet of photographic film 13 into an exposure position, and returns the sheet into the magazine after exposure. The typical projection chamber further has several ports suitable for attaching a camera, one of which is usually situated at the bottom of the chamber. The chamber is normally evacuated via a vacuum pipe 14 leading to a gate valve 15 which can either open or close the chamber to a high vacuum pump 18. The gate valve in most modern TEMs currently is controlled pneumatically via two inlets 16 and 17 such that introduction of pressurized air into one inlet causes the valve to open, and introduction of pressurized air into the other inlet causes the valve to close.

Because the photographic film 13 is housed inside the projection chamber, exchanging exposed film requires the projection chamber to be vented. In modern microscopes this is accomplished through an automated sequence of events which includes the closing of valve 15 to isolate the high vacuum pump 18 from the projection chamber 10, venting the chamber, exchanging the film magazine for a fresh one, pumping the chamber out with a roughing pump to about $10^{-3}$ torr, and finally opening valve 15 to the high vacuum pump, which brings the chamber to a vacuum typically in the $10^{-6}$ torr range. As long as valve 15 is open, the vacuum inside the chamber is therefore always better than $10^{-3}$ torr.

The slow scan CCD camera 40 comprises a scintillator 41 which converts the electron image into a light image, a 2-dimensional charge-coupled device (CCD) sensor 43, and a fiber-optic faceplate 42 which transfers the light image from the scintillator to the CCD. CCD sensors up to 2048 by 2048 pixels in size suitable for this application are presently available from several manufacturers, including Tektronix Inc., Thomson CSF, and English Electric Valve Ltd. The CCD must be operated cold to keep its dark current small enough so that the noise in the current accumulated during a typical exposure does not limit the performance of the camera. The typical exposure in an electron microscope is 1 to about 20 seconds. CCD temperature of about $-30°$ C. is sufficiently low for the accumulated dark current to be acceptably small at exposure times up to about 1 minute. This temperature is easily achieved by a thermoelectric cooler 44, whose cold side is in contact with the CCD, and warm side is in contact with the body of the camera 40. The camera body can either dissipate the heat from the thermoelectric cooler into the massive body of the electron microscope, or it can be cooled by a recirculating fluid. The CCD is connected via a vacuum feed-thru 45 to external electronics unit 46 which transfers the captured images to the memory of a digital computer 47, which displays the images on the display screen 48.

The camera is attached to the projection chamber via an intermediate chamber 20 housing a vacuum valve 33 which can seal off the camera by applying O-ring 34 to a sealing surface around the camera aperture 21. The valve is operated pneumatically by piston 31 attached to valve 33 by a connecting rod 32. The piston moves inside a pneumatic cylinder 30 which is sealed off from the high vacuum inside the projection chamber by O-ring 37. The piston is moved by applying pressurized air to inlets 35 and 36. Applying pressurized air to inlet 35 causes the valve to open, and applying pressurized air to inlet 36 causes the valve to close.

Because the CCD sensor 43 and also the faceplate 42 and scintillator 41 are held at about $-30°$ C. during operation of the camera, ice would build up on these elements if they were exposed to a water pressure higher than about 0.3 torr. The ice would then prevent the electrons from reaching the scintillator in subsequent operation, and would cause damage to the conductive coating applied to the surface of the scintillator. Even more importantly, ice or water condensation may irreparably damage the CCD sensor. The inside of the CCD camera therefore must not be exposed to either air or poor vacuum while the CCD element is cold. This is achieved by connecting the pressurized air hoses leading to inlets 35 and 36 directly to the hoses leading to the inlets 16 and 17 of the high vacuum pump 18 in such manner that valves 15 and 33 operate in parallel such that whenever the high vacuum pump is isolated from the projection chamber, the CCD camera is also isolated from the projection chamber, and whenever the high vacuum pump valve 15 is open, the CCD camera valve 33 is also open. Hence the operation of the camera is completely automatic, and the user can vent the projection chamber whenever desirable without having to take any special precautions to protect the scintillator and the CCD sensor.

A manual override which is needed for the initial pump-down of the CCD camera after installation on the projection chamber is conveniently provided by using Quick-connect connectors manufactured by Colder Products Inc. to connect the pressurized hoses to the inlets 35 and 36. These connectors shut off whenever disconnected, thereby permitting the connection scheme to be reversed while the microscope is under operation, and allowing the valve 33 to be opened while valve 15 is closed.

Figure 2:
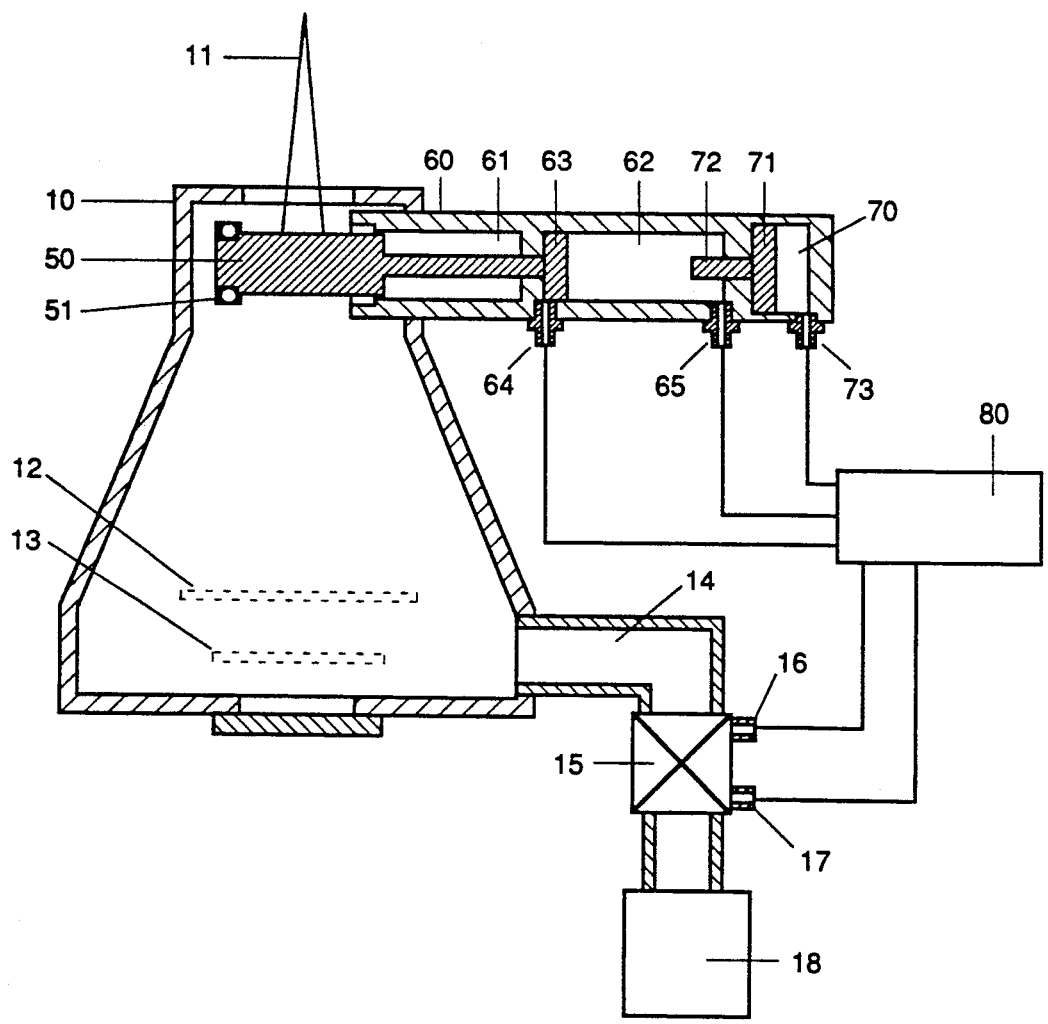
FIG. 2 shows a schematic view of a cooled CCD camera mounted on a movable platform which transports the camera between a working position inside a projection chamber of an electron microscope and a withdrawn position in which the camera is housed in a sealed vacuum enclosure.

FIG. 2 shows an alternate embodiment of the invention, in which slow-scan CCD camera 50 is attached to a pneumatically operated piston 63, which transports the camera between a working position in which it intercepts the electron beam 11 inside the projection chamber 10, and a retracted position in which it is inside vacuum enclosure 61, and sealed off from the projection chamber by means of O-ring 51. The camera is attached to piston 63 which is moved by applying pressurized air to inlets 64 and 65. Applying pressurized air to inlet 65 causes the camera to be inserted into the working position, and applying pressurized air to inlet 64 causes the camera to be retracted.

There is also a third position of the camera in which it is withdrawn from the electron beam, but is not sealed off. This position is achieved by simultaneously applying pressurized air to inlets 64 and 73. Pressurized air applied to inlet 73 causes piston 71 to advance such that rod 72 pushes inside pneumatic chamber 62 and defines a new end-stop for piston 63. When the piston 63 is resting against this end-stop, the camera is withdrawn from the beam, but has not fully entered the vacuum enclosure 61, and therefore continues to be evacuated along with the rest of the projection chamber. The necessary distribution of pressurized air to the inlets 64, 65 and 73 is accomplished by a control unit 80, which is also connected to the pressurized hoses leading to gate valve 15. The control unit is able to sense the position of valve 15, and causes the camera to be fully inserted into vacuum enclosure 61 if the projection chamber is about to be vented. Alternately, the control unit could sense the state of the vacuum inside the projection chamber of the microscope by an electrical connection to a microscope electronics unit controlling or sensing the vacuum inside the projection chamber, or it could be connected to a vacuum gauge inside the projection chamber. The control unit also has a manual switch permitting the user to select whether the camera is inserted into the electron beam or withdrawn from it by partial insertion into chamber 61.

Figure 3:
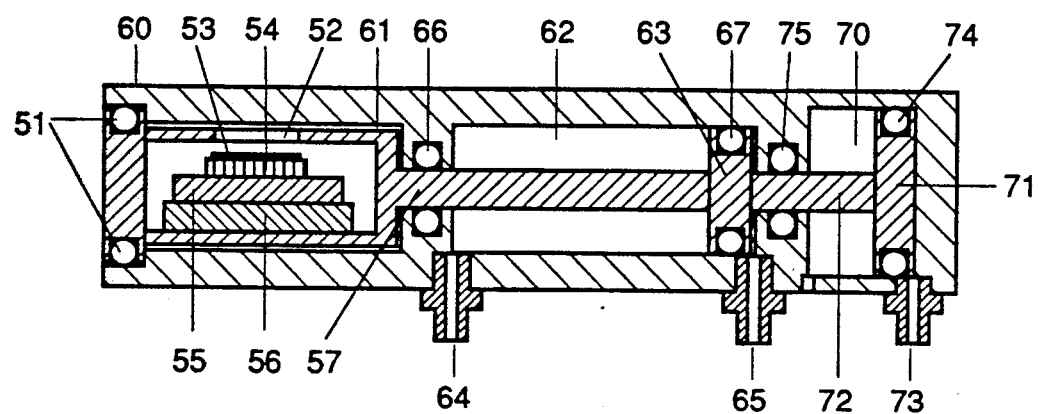
FIG. 3 shows a detailed schematic view of the cooled CCD camera of FIG. 2 in the fully withdrawn position.

FIG. 3 shows a detailed schematic view of the camera fully withdrawn into enclosure 60. The camera comprises an electron scintillator 53 mounted behind an opening 52, a fiber-optic face plate 54, a CCD sensor 55, and a thermoelectric cooler 56. The heat produced by the cooler is carried by rod 57 and piston 63 to the camera housing 60 and from there into the rest of the microscope. O-ring 51 seals vacuum enclosure 61 from the projection chamber, O-ring 66 isolates vacuum chamber 61 from pneumatic chamber 62, O-ring 67 seals the pneumatic piston 63, O-ring 75 isolates pneumatic chamber 70 from pneumatic cylinder 62, and O-ring 74 seals the pneumatic piston 71. The camera is mounted at the top of the projection chamber 10, but it could also be mounted at the bottom of the chamber, just in front of a TV-rate camera or an electron spectrometer, and be withdrawn from the electron beam whenever it its necessary to operate the other instrument.

Figure 4:
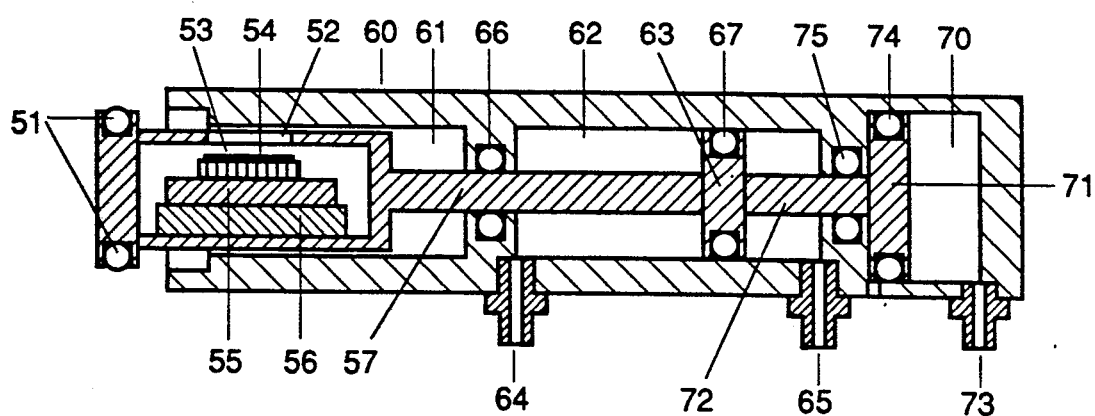
FIG. 4 shows a detailed schematic view of the cooled CCD camera of FIG. 2 in intermediate position in which it is withdrawn from the electron beam but is not sealed off inside the separate vacuum enclosure.

FIG. 4 shows a detailed schematic view of the camera partially withdrawn into enclosure 60. Pressurized air is applied simultaneously to inlets 64 and 73. The pneumatic piston 71 has a larger diameter than piston 63, and therefore exerts the greater force. As a result, piston 71 is at the limit of its travel, and rod 72 creates an end-stop for piston 63, which prevents O-ring 51 from sealing the camera off inside chamber 61.

Figure 5:
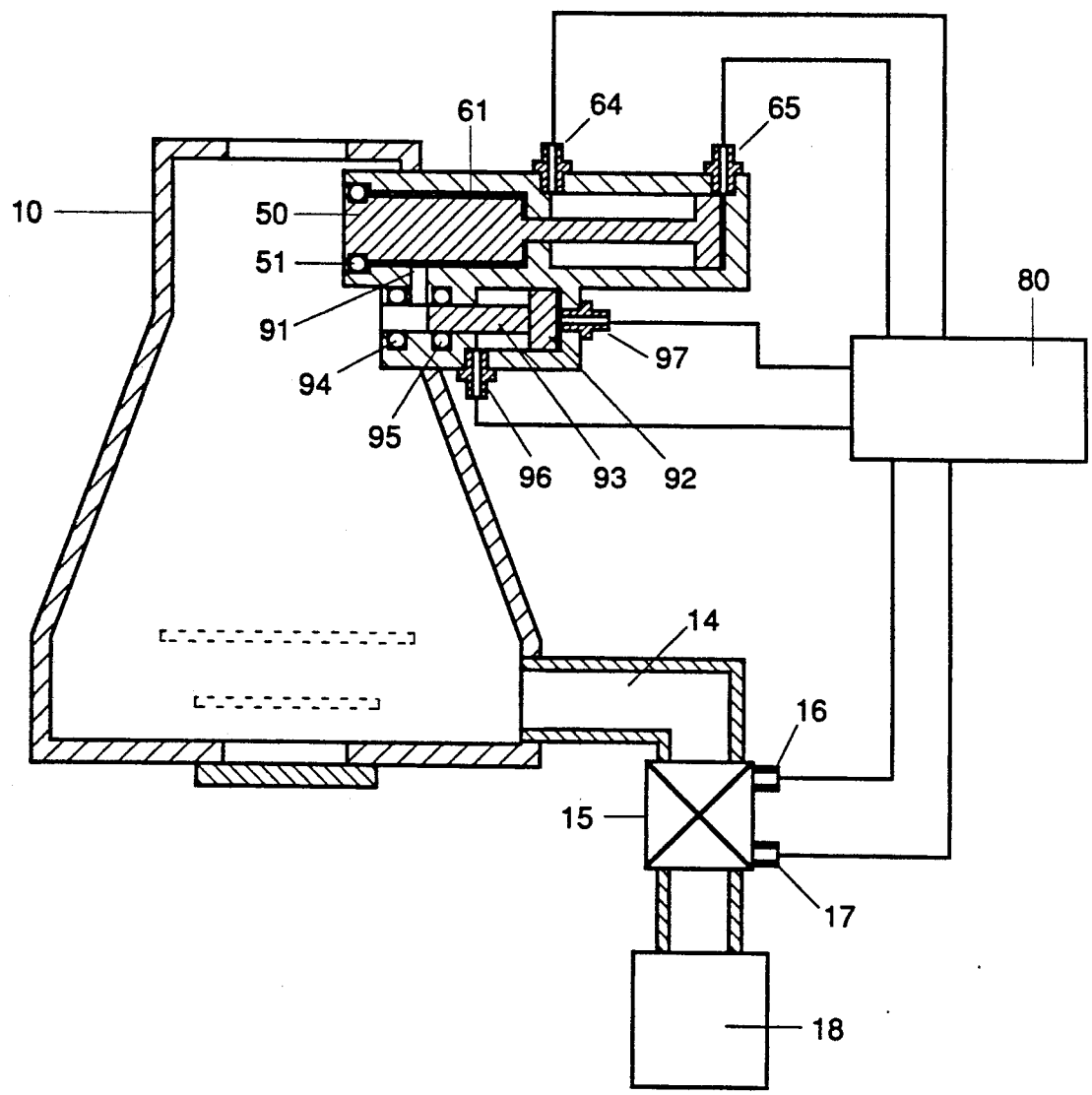
FIG. 5 shows a schematic view of a cooled CCD camera comprising a pneumatically operated vacuum valve which enables the camera to be pumped while it is retracted into a vacuum enclosure.

FIG. 5 shows a schematic view of a CCD camera 50 fully withdrawn into a vacuum enclosure 61, but open to the vacuum inside projection chamber 10 via opening 91. The enclosure 61 can also be sealed off by applying pressurized air to inlet 97, which causes piston 92 to move such that rod 93 is inserted into O-ring 94, thereby sealing opening 91 from projection chamber 10. Applying pressurized air to opening 96 instead retracts rod 93 and opens enclosure 61 to the vacuum inside projection chamber 10. O-ring 95 provides a seal around rod 93 in both the retracted and open positions, and prevents pressurized air from reaching inside the evacuated enclosures. The required distribution of pressurized air is provided by control unit 80, which senses the state of vacuum inside the projection chamber by being connected to pressurized air hoses controlling valve 15 which separates the projection chamber from a high vacuum pump 18, or by having an electrical connection to a microscope electronics unit controlling or sensing the vacuum inside the projection chamber, or to a vacuum gauge inside the projection chamber.

The described embodiments of the slow scan CCD camera are also suitable for mounting on the specimen chamber of a scanning electron microscope (SEM). In a typical modern SEM, introducing bulky specimens into the specimen chamber requires venting the chamber, and there is a pneumatic gate valve isolating the chamber from the microscope high vacuum pump using an arrangement which is precisely analogous to the way a high vacuum pump is connected to the projection chamber of a TEM. The primary use of a slow scan CCD camera comprising a scintillator inside the specimen chamber of an SEM is to image electron and X-ray diffraction patterns such as electron back-scattering patterns and X-ray Kossel patterns, both of which contain valuable information on specimen crystallography. The patterns are typically quite weak, making the high sensitivity of a slow scan CCD camera especially valuable.

While the above description contains many specificities, the reader should not construe these as limitations on the scope of the invention but merely as exemplifications of the preferred embodiment thereof. Those skilled in the art will envisage other possible variations within its scope. For example, the claimed device may also be used as an image sensor in an imaging filter which disperses the electron beam into an energy spectrum, selects a pass-band in the spectrum, and forms an image or a diffraction pattern with only electrons of the selected energy. Images produced by such a filter are typically weak in intensity, making the high sensitivity and excellent dynamic range of a slow scan CCD camera especially valuable. The filter may conveniently be attached to the bottom port in a TEM projection chamber, the slow scan CCD camera attached at the end of the electron path through the filter, and the gate valve may be mounted between the filter and the camera or between the whole filter and the microscope projection chamber.

What is claimed is:

1. An apparatus for recording images and diffraction patterns produced by an electron microscope, said apparatus comprising:
   i) a cooled charge-coupled imaging device contained in a vacuum enclosure,
   ii) an isolation valve connecting said vacuum enclosure with a chamber of said electron microscope, and
   iii) automatic actuating means for said isolation valve whereby whenever air is admitted into the electron microscope chamber, said automatic means close said isolation valve, thereby preventing water condensation or ice formation on said cooled charge-coupled imaging device.

2. The apparatus of claim 1 wherein said automatic actuating means comprises a pneumatic connection with a gate valve between a high vacuum pump and the electron microscope chamber whereby when said gate valve is opened or closed, said isolation valve operates automatically in unison.

3. The apparatus of claim 1 further comprising an electron scintillator and a fiber-optic plate, said scintillator converting an electron image or diffraction pattern into a light image, and said fiber-optic plate transferring said light image to said charge-coupled device.

4. The apparatus as claimed in claim 1 wherein the electron microscope chamber is the projection chamber of a transmission electron microscope.

5. The apparatus as claimed in claim 1 where the electron microscope chamber is the specimen chamber of a scanning electron microscope.

6. An apparatus for recording images or diffraction patterns produced by an electron microscope, said apparatus comprising
   i) a cooled charge-coupled imaging device mounted on a movable platform,
   ii) a vacuum enclosure attached to a chamber of said electron microscope,
   iii) automatic transport means, and
   iv) sealing means whereby whenever air is admitted to the electron microscope chamber, said automatic transport means move said movable platform into said enclosure where said sealing means isolate said vacuum enclosure from the electron microscope chamber, thereby preventing water condensation or the formation of ice on said cooled charge-coupled imaging device when air is admitted into the electron microscope chamber.

7. The apparatus of claim 6 wherein said automatic transport means comprises a pneumatic connection with a gate valve connecting a high vacuum pump and the electron microscope chamber whereby when said gate valve is opened or closed, said automatic transport means operates automatically in unison.

8. The apparatus of claim 6 further including an adjustable end-stop whereby said movable platform may be withdrawn into said vacuum enclosure but not sufficiently far for said sealing means to seal whereby said vacuum enclosure remains connected with the electron microscope chamber.

9. The apparatus of claim 6 further including an isolation valve connecting said vacuum enclosure to the electron microscope chamber.

10. The apparatus of claim 6 further comprising an electron scintillator and a fiber-optic plate, said scintillator converting an electron image or diffraction pattern into a light image, and said fiber-optic plate transferring said light image to said charge-coupled device.

11. The apparatus as claimed in claim 6 where the electron microscope chamber is the projection chamber of a transmission electron microscope.

12. The apparatus as claimed in claim 6 where the electron microscope chamber is the specimen chamber of a scanning electron microscope.

* * * * *